United States Patent
Tsyrganovich (10) Patent No.: US 6,907,374 B1
(45) Date of Patent: Jun. 14, 2005

(54) SELF-CALIBRATING SIGMA-DELTA ANALOG-TO-DIGITAL CONVERTER

(75) Inventor: Anatoliy V. Tsyrganovich, San Jose, CA (US)

(73) Assignee: ZiLOG, Inc., San Jose, CA (US)

(*) Notice: Subject to any disclaimer, the term of this patent is extended or adjusted under 35 U.S.C. 154(b) by 125 days.

(21) Appl. No.: 10/394,114

(22) Filed: Mar. 19, 2003

(51) Int. Cl.[7] .............................................. G01R 35/00
(52) U.S. Cl. ..................... 702/107; 702/79; 702/124; 708/307
(58) Field of Search ............................ 702/57, 58, 64, 702/69, 75, 76, 78, 79, 106, 107, 117, 118, 176, 124–126, 178, 189, 190, 197, 198; 341/61, 118, 120, 143, 155–156, 172; 708/209, 307

(56) References Cited

U.S. PATENT DOCUMENTS

| | | | | |
|---|---|---|---|---|
| 5,345,409 A | * | 9/1994 | McGrath et al. | 702/60 |
| 5,359,156 A | * | 10/1994 | Chan et al. | 178/20.02 |
| 5,544,089 A | * | 8/1996 | Hemminger et al. | 702/64 |
| 5,621,406 A | * | 4/1997 | Goetzinger et al. | 341/120 |
| 6,229,466 B1 | * | 5/2001 | Gattani | 341/120 |
| 6,232,902 B1 | * | 5/2001 | Wada | 341/143 |
| 6,271,781 B1 | * | 8/2001 | Pellon | 341/143 |
| 6,445,317 B2 | * | 9/2002 | Lundin et al. | 341/120 |
| 6,646,581 B1 | * | 11/2003 | Huang | 341/143 |
| 6,677,876 B1 | * | 1/2004 | Hoggarth et al. | 341/143 |

OTHER PUBLICATIONS

Fattaruso et al., "Self–Calibration Techniques for a Second–Order Multibit Sigma–Delta Modulator", Dec. 1993, Solid–State Circuits, IEEE Journal of, vol. 28, pp. 1216–1223.*
Baird et al., "A Low Oversampling Ratio 14–b 500–kHz Delta–Sigma ADC with a Self–Calibrated Multibit DAC", Mar. 1996, Solid–State Circuits, IEEE Journal of, vol. 31, pp. 312–320.*

* cited by examiner

Primary Examiner—Marc S. Hoff
Assistant Examiner—Mary Catherine Baran
(74) Attorney, Agent, or Firm—Silicon Edge Law Group LLP; Darien K. Wallace; T. Lester Wallace (57) ABSTRACT

A self-calibrating sigma-delta converter (SCADC) functions in a calibration mode and in an operational mode. In the calibration mode, a test circuit of the SCADC generates test signals that are periodic rectangular voltage waveforms. Each test signal has a dc component with a precise voltage amplitude, as well as harmonic components. A low-pass filter of a sigma-delta converter (SDC) within the SCADC filters out the harmonic components. A digital calibration processing circuit within the SCADC uses the precise voltage amplitudes to generate digital correction factors that compensate for dc offset error, gain error and INL error of the SDC. In the operational mode, the SDC receives an analog operational signal and outputs an operational digital data stream. The digital calibration processing circuit uses the correction factors to compensate for dc offset error, gain error and INL error in the operational digital data stream and outputs a corrected digital data stream.

25 Claims, 6 Drawing Sheets

| MAJOR CORRESPONDING ERROR TYPE | INPUT VOLTAGE | TEST DIGITAL VALUE | DIGITAL CORRECTION FACTOR | APPLY TO RANGE | DIGITAL RANGE |
|---|---|---|---|---|---|
| DC OFFSET ERROR | 0.0 VOLTS | 62 | -62 | A | 0 - 95 |
| INL ERROR | 0.5 VOLTS | 191 | -64 | B | 96 - 233 |
| INL ERROR | 1.0 VOLTS | 276 | -21 | C | 234 - 299 |
| INL ERROR | 1.5 VOLTS | 323 | +60 | D | 300 - 348 |
| INL ERROR | 2.0 VOLTS | 373 | +138 | E | 349 - 399 |
| INL ERROR | 2.5 VOLTS | 426 | +213 | F | 400 - 519 |
| INL ERROR | 3.0 VOLTS | 613 | +154 | G | 520 - 689 |
| INL ERROR | 3.5 VOLTS | 766 | +129 | H | 690 - 894 |
| GAIN ERROR | 4.0 VOLTS | 831 | +192 | I | 895 - 1023 |

SELF-CALIBRATING SIGMA-DELTA ANALOG-TO-DIGITAL CONVERTER

TECHNICAL FIELD

The present invention relates to analog-to-digital converters, and more specifically to a self-calibrating analog-to-digital converter that compensates for various types of error.

BACKGROUND

A sigma-delta analog-to-digital converter converts a voltage amplitude of an analog input signal into a corresponding digital value of a digital data stream. Where the minimum voltage amplitude of the analog input signal is a ground potential, the analog-to-digital converter (ADC) ideally converts the ground potential to a minimum digital value. If, for example, the ADC is a ten-bit ADC, then the minimum digital value would typically be a ten-bit digital value of ten digital zeros. The extent to which the digital value of the digital data stream of the ADC deviates from digital zero is referred to as "dc offset error."

Where the maximum voltage amplitude of the analog input signal is a reference voltage, the ADC ideally converts the reference voltage to a maximum digital value. If the ADC is a ten-bit ADC, then the maximum digital value would typically be a ten-bit digital value of ten digital ones. The extent to which the digital value output by the ADC deviates from a digital value of all digital ones is referred to as "gain error."

Moreover, any given voltage amplitude that lies between the ground potential and the reference voltage is ideally converted into a digital value that is the same proportion of the maximum digital value as the given voltage amplitude is of the reference voltage. In other words, a linearly increasing voltage amplitude is ideally converted by the ADC into a linearly increasing digital value. The extent to which the ADC receives an analog input signal with a linearly increasing voltage amplitude and outputs digital values that do not linearly increase in value is referred to as "integral non-linearity error" (INL error).

Figure 1:
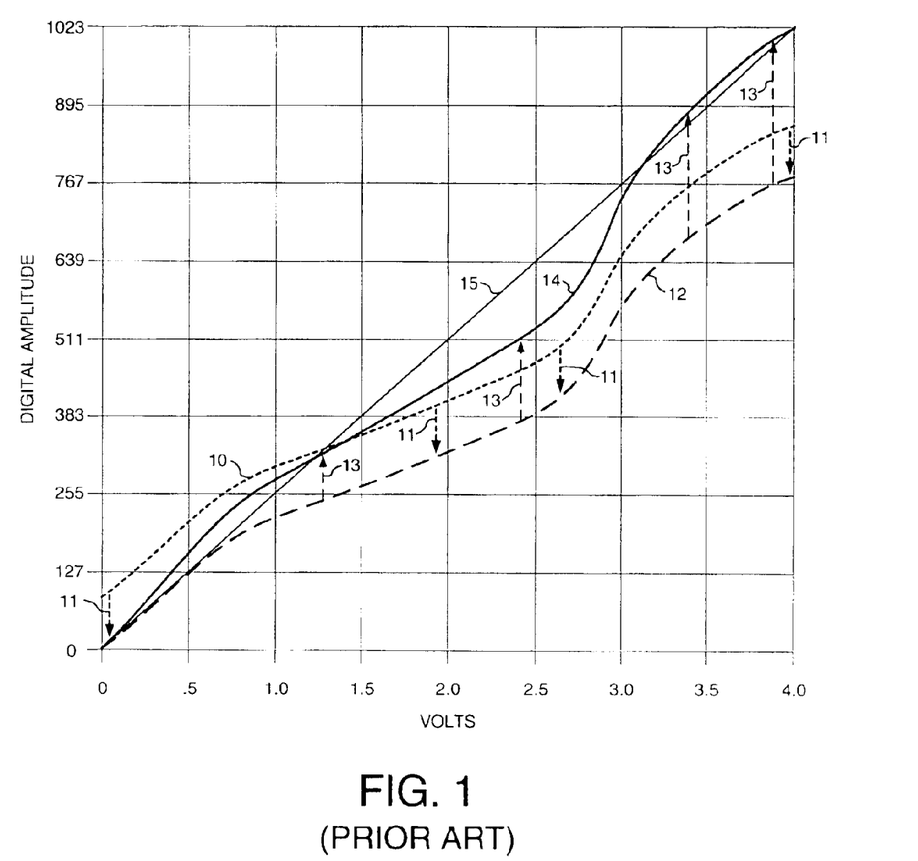
FIG. 1 (prior art) is a graph of analog input voltage amplitude versus digital amplitude of digital values output by a prior art ADC.

FIG. 1 (prior art) is a graph of digital values output by a hypothetical prior art ADC that receives an analog input signal having voltage amplitudes between zero volts and four volts. The actual, uncorrected digital values output by the ADC are shown as dashed curve 10. A correction value 11 is applied to each digital value output by the ADC to compensate for dc offset error. Although correction value 11 compensates for a positive dc offset error of the hypothetical ADC, dc offset error of other analog-to-digital converters can be negative. The digital output of the ADC for analog inputs having voltage amplitudes between zero and four volts, after compensating for dc offset error, is represented by dashed curve 12.

Secondly, each digital value output by the ADC is also corrected by proportionate values 13 to compensate for gain error. Thus, the proportionate values 13 increase with increasing voltage amplitude of the analog input signal. Although the hypothetical ADC compensates for gain error by multiplying the digital value output by the hypothetical ADC by a coefficient greater than one to obtain the proportionate values 13, gain error of other analog-to-digital converters can require correction by multiplying by a coefficient of less than one. Solid curve 14 represents the digital values output by the ADC for given voltage amplitudes of an analog input signal after correction for dc offset error and gain error. Finally, straight line 15 represents the digital values output by the ADC after correction for dc offset error, gain error and INL error.

There are various known prior art methods for correcting for dc offset error, gain error and INL error. A first prior art method involves testing each integrated circuit chip containing an ADC with external testing equipment. The external testing equipment produces an analog input signal having a precise voltage amplitude of zero volts. The amount by which the digital value of the output of the ADC differs from the minimum possible digital value is included in a lookup table as the dc offset error. In FIG. 1 (prior art), the minimum possible digital value is shown as digital zero. The testing equipment then produces an analog input signal having a precise voltage amplitude of the reference voltage, shown in FIG. 1 (prior art) as four volts. For an analog input signal having a voltage amplitude of four volts, the proportion by which the digital value of the output of the ADC differs from the maximum possible digital value is included in a lookup table as a coefficient representing the gain error. FIG. 1 (prior art) shows a maximum digital value of 1023, corresponding to the maximum possible digital value output by a ten-bit ADC. The coefficient is the factor by which each digital value of dashed curve 12 is multiplied to yield solid curve 14.

The external testing equipment in the first prior art method then produces a limited number of analog input signals having precise voltage amplitudes between zero and four volts. The resulting limited number of digital values of the output of the ADC are detected by a correction circuit of the ADC. The correction circuit corrects the digital values to account for dc offset error and gain error by the method described above. Then the corrected digital values are used mathematically to derive a polynomial curve, such as solid curve 14. A larger number of points from the polynomial curve are then included in the lookup table. Each of the larger number of points in the lookup table has a correction factor that is applied to its corresponding digital value output by the ADC. When the ADC operates, the actual digital output of the ADC is adjusted mathematically using values in the lookup table that account for dc offset error, gain error and INL error. The result is a corrected digital output approximating straight line 15.

The process of testing each integrated circuit ADC chip in the first prior art method using external testing equipment is both costly and time consuming.

A second prior art method involves manufacturing a voltage dividing network on each integrated circuit ADC chip. The voltage dividing network is then used to generate analog input signals having precise voltage amplitudes. Each resistor of the voltage dividing network can be trimmed using a laser to produce a more precise resistance. A lookup table with correction factors to account for dc offset error, gain error and INL error is then compiled in a manner similar to that of the first prior art method. Manufacturing the resistors of the voltage dividing networks and calibrating the resistors through trimming is, however, costly and time consuming.

An apparatus and a method are sought to calibrate an ADC to compensate for various types of error without using external testing equipment or on-chip voltage dividing networks to generate analog input signals with precise voltage amplitudes.

SUMMARY

A self-calibrating sigma-delta analog-to-digital converter (SCADC) includes an analog-to-digital sigma-delta converter (SDC), a test circuit and a digital calibration processing circuit. The SCADC calibrates the SDC to compensate for various types of error by supplying the SDC with test signals having precise dc voltages.

In a calibration mode, the test circuit generates the test signals. Each test signal has a substantially rectangular time domain periodic waveform with a time period (T), a pulse time portion (PTP) and a remaining time portion. The pulse time portion can include multiple pulses and is the total time during each time period when the amplitude of the test signal equals Vref. Thus, each test signal has a reference voltage (Vref) during the pulse time portion and a ground potential during the remaining time portion. According to Fourier analysis, a complex periodic rectangular voltage waveform can be expressed in the frequency domain as the sum of a dc voltage component and a series of sinusoidal harmonic voltage components. The dc voltage component of each test signal has a voltage amplitude equal to Vref(PTP/T).

As set forth above, each test signal also has sinusoidal harmonic components. After a sigma-delta modulator within the SDC shapes the test signals, a low-pass filter within the SDC filters out the harmonic components of the test signals. Accordingly, by supplying a rectangular time domain periodic waveform test signal, the SDC is supplied with a precise dc voltage component that is converted by the SDC into a digital value.

The digital calibration processing circuit controls the test circuit to supply the SDC with a test signal having a known precise dc voltage and predefined harmonic components. The digital calibration processing circuit then receives the test digital value output by the SDC and generates digital correction factors that compensate for various types of error produced by the SDC, including dc offset error, gain error and INL error.

In an operational mode, the SDC receives an analog operational signal and outputs an operational digital data stream. The digital calibration processing circuit uses the correction factors determined in the calibration mode to compensate for the various types of error in the operational digital data stream and outputs a corrected digital data stream. A test signal with a precise dc voltage is therefore supplied to the SDC without using either external test equipment or an on-chip voltage dividing network.

A method for digitizing an analog operational signal with an SDC and correcting for various types of error produced by the SDC includes a calibration mode and an operational mode. The calibration mode involves generating a pulse select signal (a digital bit stream). The pulse select signal is in turn used to generate a test signal. The test signal has a substantially rectangular time domain periodic waveform, with a time period (T), a pulse time portion (PTP) and a remaining time portion. The test signal has a reference voltage (Vref) during the pulse time portion and a ground potential during the remaining time portion. The test signal has a dc component and harmonic components. The dc component of the test signal has a voltage amplitude equal to Vref(PTP/T).

The test signal is digitized by a sigma-delta modulator within the SDC to generate a test intermediate data stream. The test intermediate data stream has a dc component and harmonic components. The dc component of the test intermediate data stream is passed through a low-pass filter of the SDC such that the low-pass filter substantially filters out the harmonic components of the test intermediate data stream but passes the dc component. The low-pass filter outputs a corresponding test digital value. The digital calibration processing circuit uses the test digital value output by the SDC to calculate a correction factor required to obtain a known ideal digital value. The precise dc component supplied to the SDC is known, and therefore the ideal digital value is known. The ideal digital value is equal to the quotient (PTP/T) times the difference between the maximum possible digital value that can be output by the SDC and the minumum possible digital value that can be output by the SDC.

The operational mode involves receiving an analog operational input signal and generating an operational intermediate data stream. Each of the digital values of the intermediate data stream has an error. The intermediate data stream is passed through the low-pass filter within the SDC, and the low-pass filter outputs an operational digital data stream. The operational digital data stream contains a stream of digital values, each of which represents a voltage amplitude of the operational input signal supplied to the SDC. Each digital value, however, contains an error.

An appropriate correction factor determined in the calibration mode is added to each of the digital values of the operational digital data stream to output a stream of corrected digital values. Each of the corrected digital values is output from the SCADC such that each digital value in the stream contains no error.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 2:
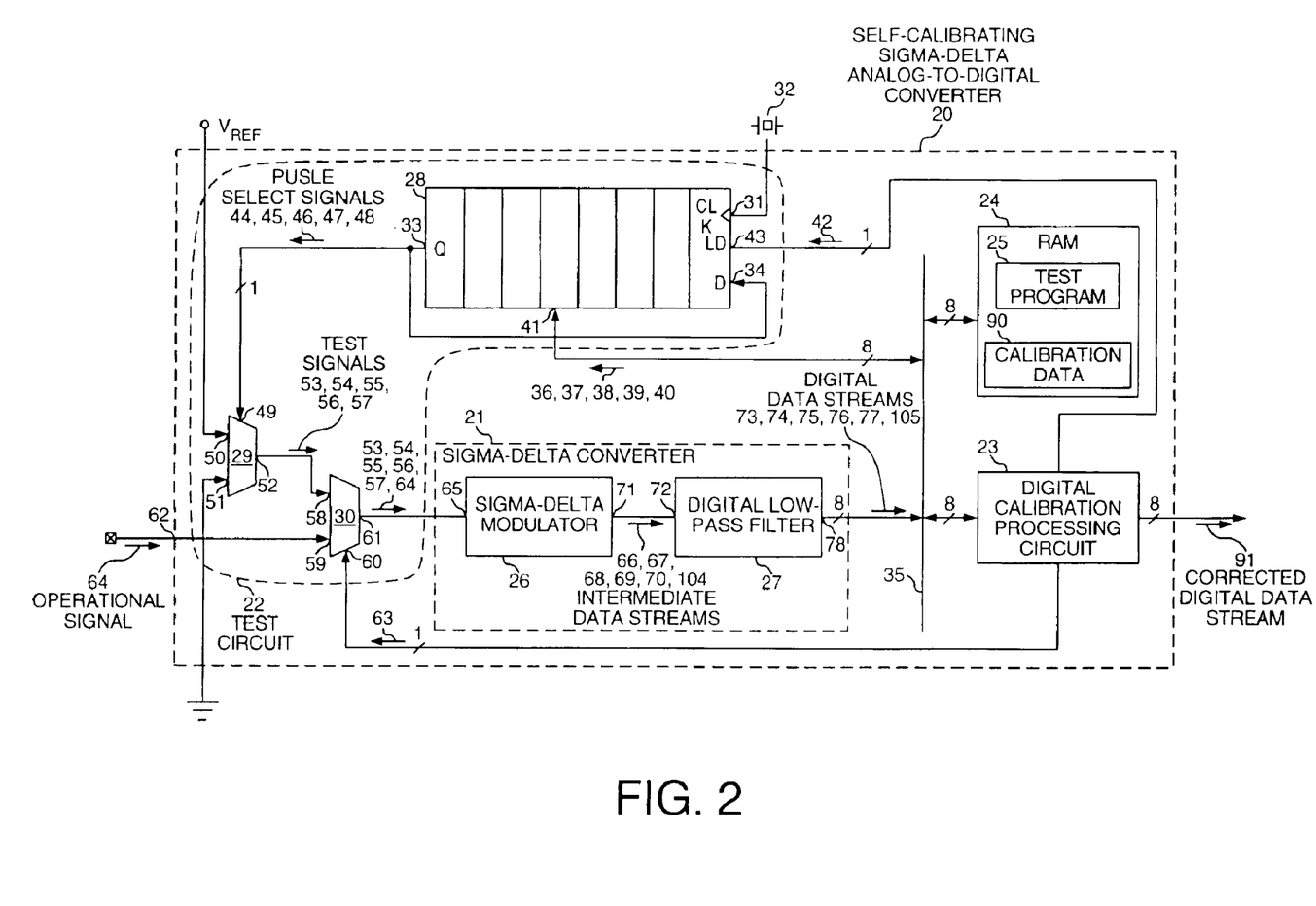
FIG. 2 is a simplified schematic block diagram of a self-calibrating sigma-delta analog-to-digital converter (SCADC) in accordance with an embodiment of the present invention.

FIG. 2 shows a self-calibrating sigma-delta analog-to-digital converter (SCADC) 20 with a sigma-delta converter (SDC) 21, a test circuit 22, a digital calibration processing circuit 23, and random access memory (RAM) 24. SDC 21 includes a sigma-delta modulator 26 and a digital low-pass filter 27. SCADC 20 functions in an operational mode and in a calibration mode. For additional information on sigma-delta analog-to-digital converters, see U.S. patent application Ser. No. 10/331,037, by Anatoliy V. Tsyrganovich, filed Dec. 27, 2002 (the entirety of which is hereby incorporated by reference).

In the calibration mode, test circuit 22 generates analog test signals, each having a precise dc voltage amplitude. Test signals are generated that have matching harmonic components. Digital low-pass filter 27 in SDC 21 has a transfer function such that digital low-pass filter 27 filters out substantially all frequency components of each analog test signal other than the dc component. Supplying the analog test signals to SDC 21 therefore effectively supplies precise dc voltages to SDC 21. SDC 21 is an analog-to-digital converter that outputs digital values representing the dc voltages. Accordingly, by supplying SDC 21 with analog test signals having precise and known dc components, as well as harmonic components whose frequencies match the notches of low-pass filter 27, SDC 21 can be calibrated to compensate for various types of error.

Operation of test circuit 22 in the calibration mode is as follows. Test circuit 22 includes an eight-bit shift register 28, a first analog multiplexer 29 and a second analog multiplexer 30. Eight-bit shift register 28 has a clock input lead (CLK) 31 that receives a clock signal from an external clock source, such as, a crystal oscillator 32. Shift register 28 has a data output lead (Q) 33 that is coupled back to a data input lead (D) 34 of shift register 28 so that shift register 28 operates as a barrel shifter.

In a first embodiment, digital calibration processing circuit 23 runs a test program 25 stored in RAM 24. Digital calibration processing circuit 23 is, for example, a processor. Pursuant to the test program 25, digital calibration processing circuit 23 successively places five eight-bit digital values onto eight-bit bus 35 in the calibration mode. The five digital values are: an "offset" digital value 36 [00000000], a "gain" digital value 37 [11111111], a first digital value 38 [10000100], a second digital value 39 [10100110], and a third digital value 40 [11110110]. Each eight-bit digital value results in a different pulse select signal. Digital calibration processing circuit 23 first places offset digital value 36 onto eight-bit bus 35, which in turn is supplied onto parallel load data input leads 41 of shift register 28. Digital calibration processing circuit 23 then sends a one-bit load signal 42 to a load signal input lead (LD) 43 of shift register 28 causing shift register 28 to parallel load eight-bit offset digital value 36 present on its parallel load data input leads 41. Shift register 28 operates as a barrel shifter and repetitively outputs successive bits of offset digital value 36 onto its data output lead 33 at the clock rate of crystal oscillator 32, for example, 10 MHz. The successive bits of offset digital value 36 output by shift register 28 make up a digital offset pulse select signal (PSS) 44.

Offset pulse select signal (PSS) 44 is supplied to a select input lead 49 of first analog multiplexer 29. First analog multiplexer 29 has a first data input lead 50, a second data input lead 51 and a data output lead 52. A reference voltage (Vref) is present on first data input lead 50, and ground potential is present on second data input lead 51. In this example, Vref equals four volts.

Upon receiving offset digital value 36, shift register 28 outputs offset pulse select signal (PSS) 43, which is a bitstream repeating the digital values [00000000] for a given duration of time. As all of the bits of offset pulse select signal 44 are digital zeros, first analog multiplexer 29 always selects the voltage (GND) present on its second data input lead 51 and outputs ground potential onto output lead 52. Thus, first analog multiplexer 29 outputs an offset test signal 53, which in the time domain is a waveform having a constant voltage amplitude of zero volts.

Second analog multiplexer 30 has a first data input lead 58, a second data input lead 59, a select input lead 60 and an output lead 61. First data input lead 58 is coupled to the output lead 52 of first analog multiplexer 29. Second data input lead 59 is coupled to an operational signal input lead 62 of SCADC 20, which in turn is coupled to a terminal of the integrated circuit chip on which SCADC 20 is located. The chip is, for example, a Z8 Encore Microcontroller manufactured by ZiLOG, Inc. of San Jose, Calif.

Second analog multiplexer 30 supplies a test signal to SDC 21 in the calibration mode, whereas second multiplexer 30 supplies an operational input signal 64 to SDC 21 in the operational mode. Digital calibration processing circuit 23 controls which of the signals is supplied to SDC 21 by supplying a one-bit test circuit select signal 63 onto the select input lead 60 of second analog multiplexer 30. If the test circuit select signal 63 is a digital zero (the calibration mode), then second analog multiplexer 30 selects a test signal from first data input lead 58, whereas if the test circuit select signal 63 is a digital one (the operational mode), then second analog multiplexer 30 selects the operational input signal 64 from second data input lead 59.

In the present example of the test signal being offset test signal 53, second analog multiplexer 30 selects offset test signal 53 present on its first data input lead 58 and supplies it to an input 65 of sigma-delta modulator 26 of SDC 21. Sigma-delta modulator 26 digitizes offset test signal 53 and outputs an offset test intermediate data stream 66 onto an output lead 71. Output lead 71 is coupled to an input lead 72 of digital low-pass filter 27.

Offset test intermediate data stream 66 is a digital data stream with a constant digital amplitude. In the frequency domain, offset test intermediate data stream 66 has a dc component with a digital amplitude of a test digital value. The test digital value deviates from ten digital zeros by some error. Offset test intermediate data stream 66 is supplied to digital low-pass filter 27.

Digital low-pass filter 27 passes the entire offset test intermediate data stream 66 because data stream 66 has no substantial frequency component in the band of interest other than at zero Hertz. The offset test intermediate data stream 66 is output onto an output lead 78 in the form of a ten-bit offset test digital data stream 73. Each successive ten-bit value of offset test digital data stream 73 is the result of supplying the dc component of zero volts into the input of SDC 21. The ten-bit values, however, can deviate from ten digital zeros [0000000000] by some error. The first eight bits of the ten-bit value are placed into an upper register of digital low-pass filter 27, whereas remaining two bits of the ten-bit value are placed into a lower register. Digital calibration processing circuit 23 can access the ten-bit value by reading the upper and lower registers across eight-bit bus 35.

Figure 3:
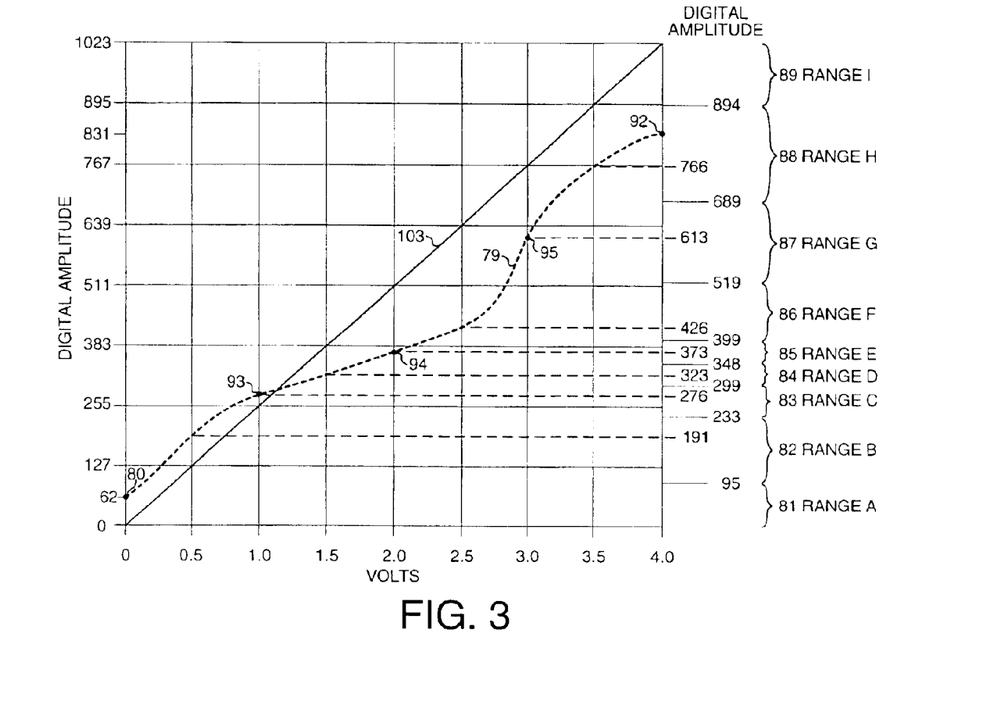
FIG. 3 is a graph of input voltage amplitude versus actual and corrected digital amplitude output by the self-calibrating SCADC of FIG. 2.

FIG. 3 shows a dashed curve 79 of analog voltage amplitudes of the dc components of test signals received by SDC 21 plotted versus the digital voltage amplitudes of the digital data streams that are output by SDC 21. In the example of the test signal being offset test signal 53, digital calibration processing circuit 23 receives offset test digital data stream 73. Test program 25 then causes digital calibration processing circuit 23 to associate an analog input voltage (in this case, zero volts) to an output digital amplitude (in this case, sixty-two). This is represented in FIG. 3 by dc offset point 80 (0, 62).

In this example, the minimum possible digital value output by SDC 21 is ten digital zeros. Therefore, digital calibration processing circuit 23 enters minus sixty-two as the digital correction factor for the dc offset error in a calibration data location 90 in RAM 24. Later in the operational mode, digital calibration processing circuit 23 generates a corrected digital data stream 91 in part by subtracting sixty-two from all of the digital amplitudes in a lowest range A (81) of digital amplitudes output by SDC 21 when SDC 21 digitizes analog operational signal 64.

Figure 4:
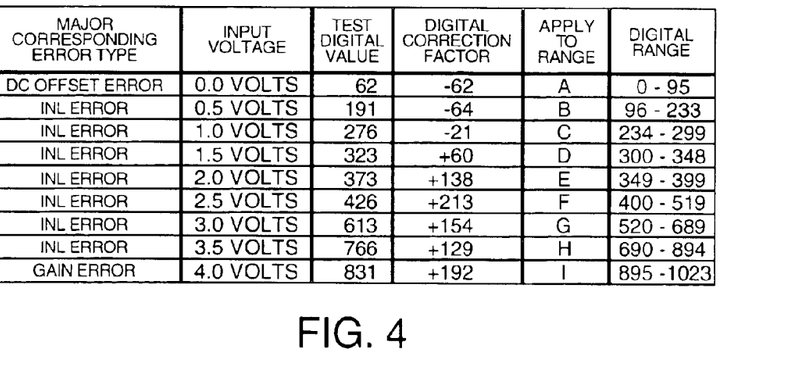
FIG. 4 is a table showing calibration data of a lookup table of the self-calibrating SCADC of FIG. 2.

FIG. 4 is a table containing sample digital correction factors for SDC 21, including the correction factor of minus sixty-two for the dc offset error. FIG. 4 shows that, in the operational mode, digital sixty-two is subtracted from digital values within range A (81), which ranges from digital zero to digital ninety-five. In this example, SDC 21 does not output a digital amplitude less than sixty-two, so the digital result after digital calibration processing circuit 23 subtracts sixty-two is never less than zero.

After determining the dc offset error as described above, test program 25 generates calibration data for gain error, as shown by point 92 in FIG. 3. Digital calibration processing circuit 23 places gain digital value 37 [11111111] onto bus 35 and causes shift register 28 to parallel load gain digital value 37 into shift register 28. Shift register 28 outputs successive bits of gain digital value 37, which make up a gain pulse select signal (PSS) 45. Gain pulse select signal 45 is supplied to select input lead 49 of first analog multiplexer 29.

Gain pulse select signal 45 is a bitstream repeating the digital values [11111111] for a given duration of time. As all of the bits of gain pulse select signal 45 are digital ones, first analog multiplexer 29 always selects the reference voltage (Vref) present on its second data input lead 51 and outputs Vref onto output lead 52. Thus, first analog multiplexer 29 outputs a gain test signal 54, which in the time domain is a waveform having a constant voltage amplitude of four volts.

Where shift register 28 is powered by Vref as opposed to the more typical supply voltage Vcc, the level shifting function of first analog multiplexer 29 is not required. In such embodiments, gain test signal 54 is generated directly by shift register 28. In the embodiment illustrated in FIG. 2, however, gain pulse select signal 45 has a maximum voltage amplitude of Vcc, whereas gain test signal 54 has a maximum voltage amplitude of Vref. First analog multiplexer 29 is therefore provided as a level shifter.

Second analog multiplexer 30 selects the signal present on its first data input lead 58, which is gain test signal 54, and outputs gain test signal 54 to SDC 21. Sigma-delta modulator 26 digitizes gain test signal 54 and outputs a gain test intermediate data stream 67 onto output lead 71.

Gain test intermediate data stream 67 is a digital data stream with a constant digital amplitude. In the frequency domain, gain test intermediate data stream 67 has a dc component with a digital amplitude of a test digital value.

The test digital value can deviate from ten digital ones by some error. Gain test intermediate data stream 67 is supplied to digital low-pass filter 27. Digital low-pass filter 27 passes gain test intermediate data stream 67 and outputs a ten-bit gain test digital data stream 74 onto output lead 78. Each successive ten-bit value of gain test digital data stream 74 is the result of supplying the dc component of four volts into the input of SDC 21. The ten-bit values, however, can deviate from ten digital ones [1111111111] by some error. Digital calibration processing circuit 23 accesses each ten-bit value by reading the upper and lower registers of digital low-pass filter 27 across eight-bit bus 35.

Digital calibration processing circuit 23 uses the ten-bit value of gain test digital data stream 74 to determine the gain error. For example, where SDC 21 converts an analog voltage of four volts into a test digital value of eight hundred thirty-one, the gain error is 1.23 (1023/831), as represented in FIG. 3 by gain error point 92 (4, 831). Digital calibration processing circuit 23 enters one hundred ninety-two as the digital correction factor for the gain error in the calibration data location 90 in RAM 24. Later in the operational mode, digital calibration processing circuit 23 adds one hundred ninety-two to all of the digital amplitudes in a highest range I (89) of digital amplitudes output by SDC 21 when SDC 21 digitizes analog operational signal 64.

After determining gain error as depicted by point 92 of FIG. 3, test program 25 calculates the integral non-linearity (INL) error of SDC 21 by determining calibration data for an additional seven points. These additional seven points correspond to test digital values of digital amplitudes versus analog voltages for half-volt steps between zero volts and four volts. Digital calibration processing circuit 23 determines test digital values for a total of nine precise voltages, including zero volts and four volts. For example, points 93, 94 and 95 are three of the nine points for which the analog voltage is 1.0 volts, 2.0 volts and 3.0 volts, respectively.

Test program 25 determines a point 93 by placing first digital value 38 [10000100] onto bus 35 and causing shift register 28 to parallel load first digital value 38 into shift register 28. Shift register 28 repetitively outputs successive bits of the eight-bit first digital value 38 [10000100] onto its data output lead 33 at the clock rate of 10 MHz. Shift register 28 outputs a first pulse select signal (PSS) 46, which is a bitstream repeating the digital values [10000100] for a given duration of time. First pulse select signal 46 is supplied to select input lead 49 of first analog multiplexer 29.

When a bit of first pulse select signal 46 is a digital one, then first analog multiplexer 29 selects the voltage present on its first data input lead 50 (Vref) and outputs Vref onto output lead 52. When a bit of first pulse select signal 46 is a digital zero, then first analog multiplexer 29 selects the voltage (GND) present on its second data input lead 51 and outputs ground potential onto output lead 52. Thus, first analog multiplexer 29 outputs a first test signal 55, which is a substantially rectangular time domain periodic waveform.

Figure 5:
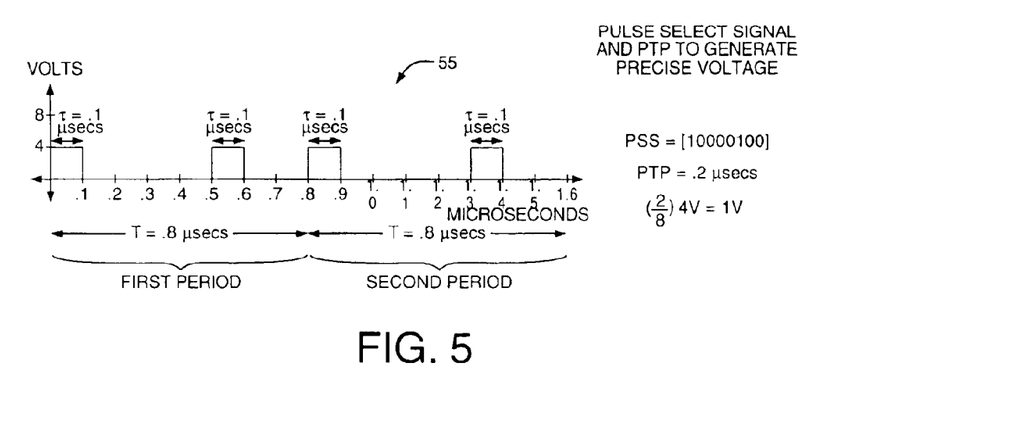
FIG. 5 is a graph of a time domain waveform of a first test signal, whose pulse time portion is one quarter of the time period of the waveform.

FIG. 5 shows two periods of the time domain waveform of first test signal 55, which is generated when first analog multiplexer 29 receives first pulse select signal 46 (PSS= 10000100). First test signal 55 is a rectangular waveform with two pulses. First test signal 55 has a time period (T) equal to eight times the clock rate. The time period of first test signal 55 is 0.8 microseconds (usec) because crystal oscillator 32 has a clock rate of 10 MHz and pulses each 0.1 microseconds (usec). First test signal 55 has a pulse time portion (PTP) equal to the amount of time during time period (T) that first test signal 55 has an amplitude equal to Vref.

First test signal 55 has a remaining time portion equal to the amount of time during time period (T) that first test signal 55 has an amplitude equal to the ground potential. The ratio PTP/T for first test signal 55 is 0.2 usec/0.8 usec, which equals one fourth.

Second analog multiplexer 30 receives first test signal 55 on first data input lead 44 and outputs first test signal 55 to SDC 21. First test signal 55 is a complex periodic rectangular voltage waveform and can, therefore, be expressed as the sum of an average dc component and a Fourier series of sinusoidal harmonic components. In the frequency domain, the dc component lies at zero Hertz and has a voltage amplitude equal to Vref(PTP/T). First test signal 55, which is comprised of the dc component and harmonic components, is supplied to input 65 of sigma-delta modulator 26 of SDC 21. Sigma-delta modulator 26 digitizes first test signal 55 and outputs a first test intermediate data stream 68 onto output lead 71.

Figure 6:
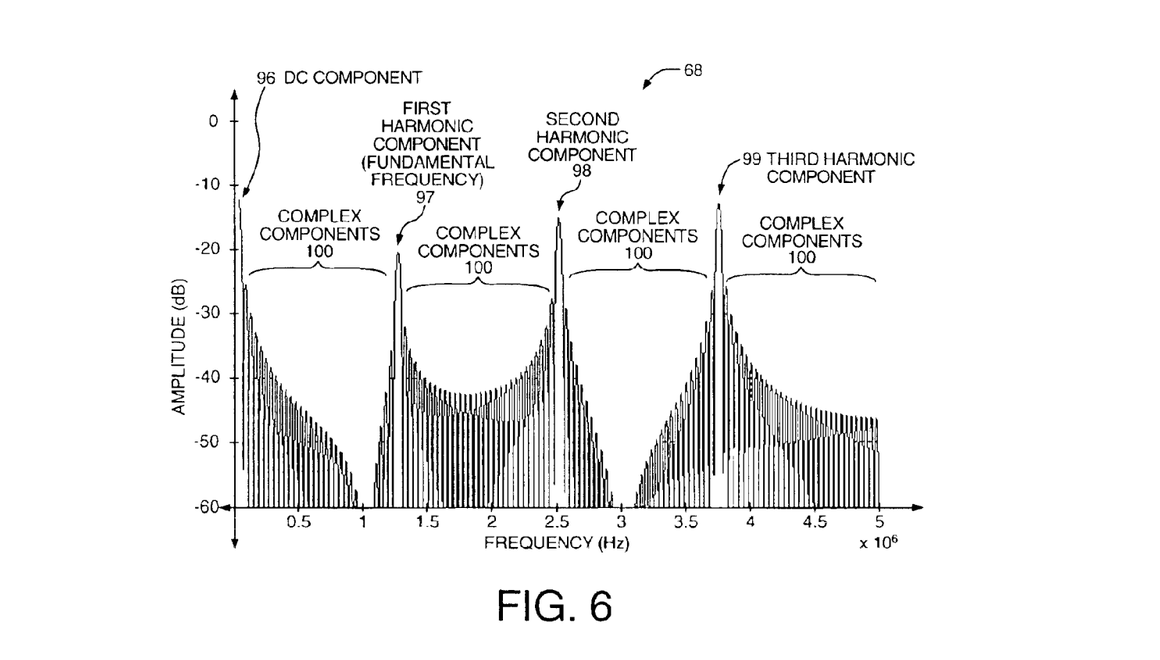
FIG. 6 is a graph in the frequency domain of the components of the first test signal of FIG. 5.

FIG. 6 is a graph in the frequency domain of first test intermediate data stream 68 that is output by sigma-delta modulator 26. The digital voltage amplitude of a dc component 96 of first test intermediate data stream 68 is shown at zero Hertz. Sigma-delta modulator 26 shapes any random quantization noise of first test signal 55 to higher frequencies. Non-random harmonic components of first test signal 55 appear as peaks of digital amplitude of first test intermediate data stream 68 in FIG. 6. The first, second and third harmonic components 97, 98 and 99 are shown. In addition to the harmonic components 97, 98 and 99 that result from the 0.8 usec time period of first test signal 55, complex components 100 of first test intermediate data stream 68 are also shown. The first, second and third harmonic components 97, 98 and 99 fall at multiples of 1.25 MHz, which is the reciprocal of 0.8 microseconds. The complex components 100 of first test intermediate data stream 68 are produced by the smaller time periods between the two pulses of first test signal 55. The first test intermediate data stream 68 shown in FIG. 6 is supplied to digital low-pass filter 27.

Figure 7:
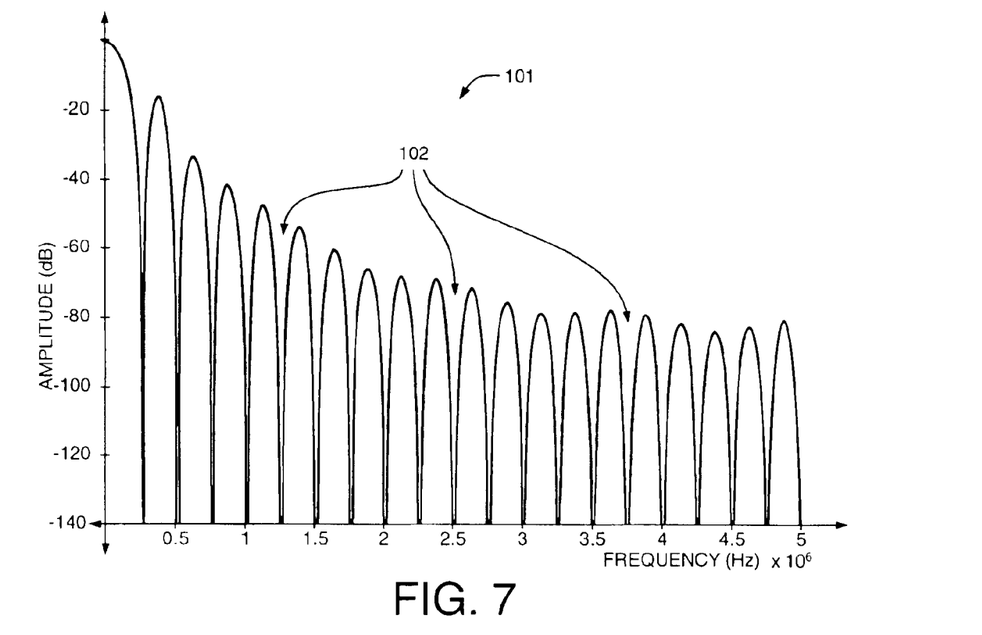
FIG. 7 is a graph showing a frequency response curve of a digital low-pass filter of the self-calibrating SCADC of FIG. 2.

FIG. 7 is a graph of the frequency response curve 101 of digital low-pass filter 27. Digital low-pass filter 27 filters first test intermediate data stream 68 and outputs first test digital data stream 75 (see FIG. 2) onto output lead 78. In the first embodiment, digital low-pass filter 27 is a finite impulse response (FIR) digital filter. Digital low-pass filter 27 is designed so that various notches 102 (see FIG. 7) of its response curve 101 fall at the frequencies of the harmonic components 97, 98 and 99 of first test intermediate data stream 68 (see FIG. 6). Thus, digital low-pass filter 27 attenuates nearly all of the harmonic components 97, 98 and 99 of first test intermediate data stream 68 so that first test digital data stream 75 is substantially composed only of a dc component. First test digital data stream 75 does include a small amount of complex components 100. Note that the complex components 100 shown in FIG. 6 have a much smaller digital voltage amplitude than does the dc component 96 considering that the amplitude in FIG. 6 is shown as a logarithmic scale (dB).

The dc component of first test digital data stream 75 has a digital voltage amplitude proportional to PTP/T, where the ratio PTP/T is the ratio for first test signal 55, which equals one fourth. Therefore, digital low-pass filter 27 outputs ten-bit first test digital data stream 75, for which each successive ten-bit value is a digital value that is output from SDC 21 when a test signal with a dc component of one fourth of Vref is supplied to the input of SDC 21. Digital calibration processing circuit 23 accesses each ten-bit value by reading the first eight bits out of the upper register and the remaining two bits out of the lower register of low-pass filter 27 across eight-bit bus 35.

After supplying first test signal 55 having a precise and known dc voltage amplitude to SDC 21, the same process is followed to supply a second test signal 56 having a distinct precise and known dc voltage amplitude to SDC 21. To accomplish this, digital calibration processing circuit 23 sends load signal 42 to load signal input lead (LD) 43 causing shift register 28 to parallel load the second digital value 39 [10100110], which digital calibration processing circuit 23 places on bus 35. The successive bits output by shift register 28 then make up a second pulse select signal (PSS) 47, which is a bitstream repeating the digital values [101001101]. Upon receiving second pulse select signal 47 on select input lead 49, first analog multiplexer 29 outputs second test signal 56.

Figure 8A:
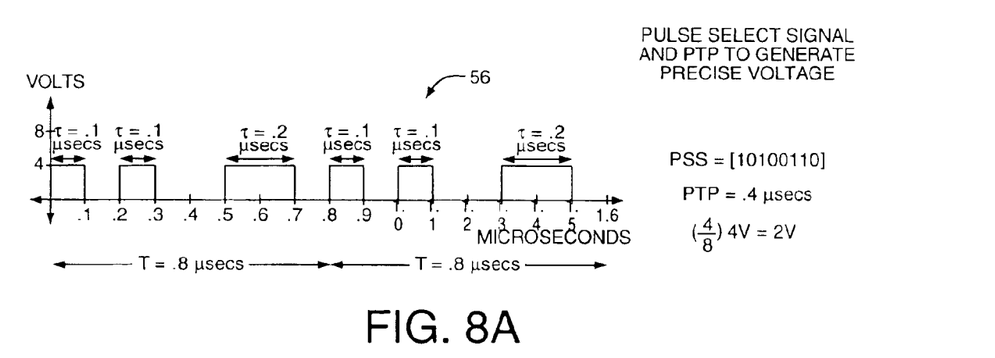
FIG. 8A is a graph of a time domain waveform of a second test signal, whose pulse time portion is one half of its time period.

FIG. 8A shows the time domain waveform of second test signal 56, which is a rectangular waveform having three pulses. Each of the first two pulses has a pulse width of 0.1 usec, and the third pulse has a pulse width of 0.2 usec. Second test signal 56 has a pulse time portion (PTP) of 0.4 usec. The ratio PTP/T for second test signal 56 is 0.4 usec/0.8 usec, which equals one half.

Figure 9A:
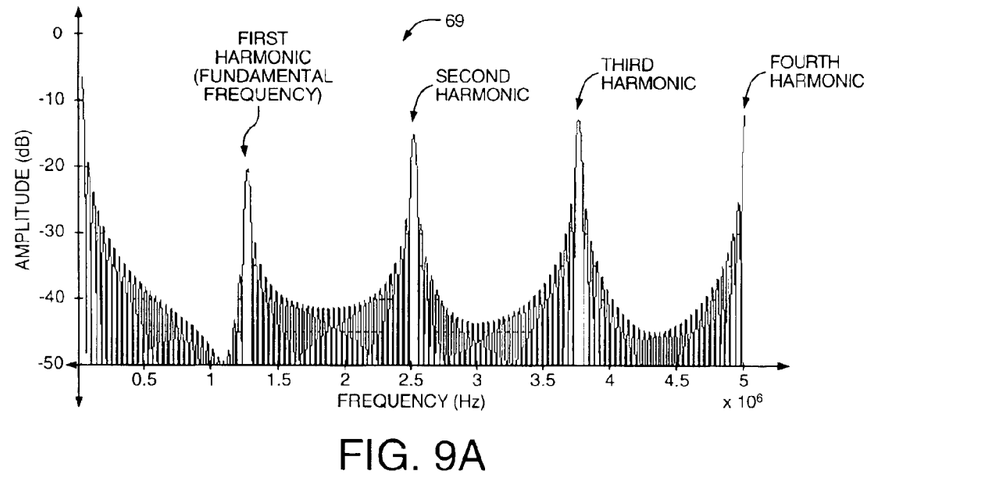
FIG. 9A is a graph in the frequency domain of the components of the second test signal of FIG. 8A.

FIG. 9A is a graph in the frequency domain of the components of a second test intermediate data stream 69, which results from second test signal 56.

Next, third digital value 40 [11110110] present on bus 35 is parallel loaded into shift register 28. Shift register 28 outputs a third pulse select signal 48, a bitstream repeating the digital values [11110110]. Upon receiving third pulse select signal 48 on select input lead 49, first analog multiplexer 29 outputs a third test signal 57.

Figure 8B:
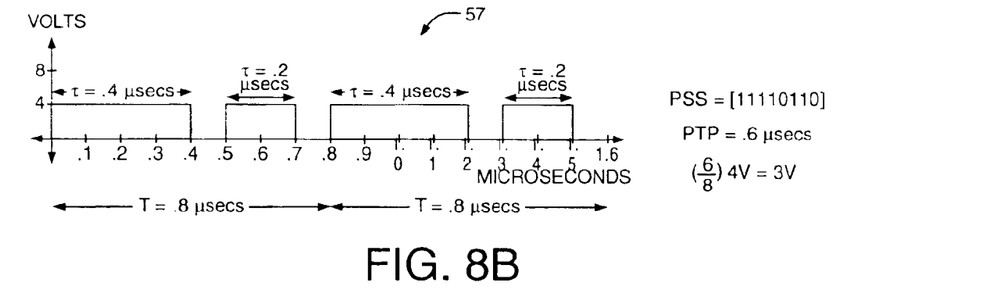
FIG. 8B is a graph of a time domain waveform of a third test signal, whose pulse time portion is three quarters of its time period.

FIG. 8B shows the time domain waveform of third test signal 57. Third test signal 57 is a rectangular waveform having two pulses. The first pulse has a pulse width of 0.4 usec, and the second pulse has a pulse width of 0.2 usec. Third test signal 57 has a pulse time portion (PTP) of 0.6 usec. The ratio PTP/T for third test signal 57 is 0.6 usec/0.8 usec, which equals three quarters.

Figure 9B:
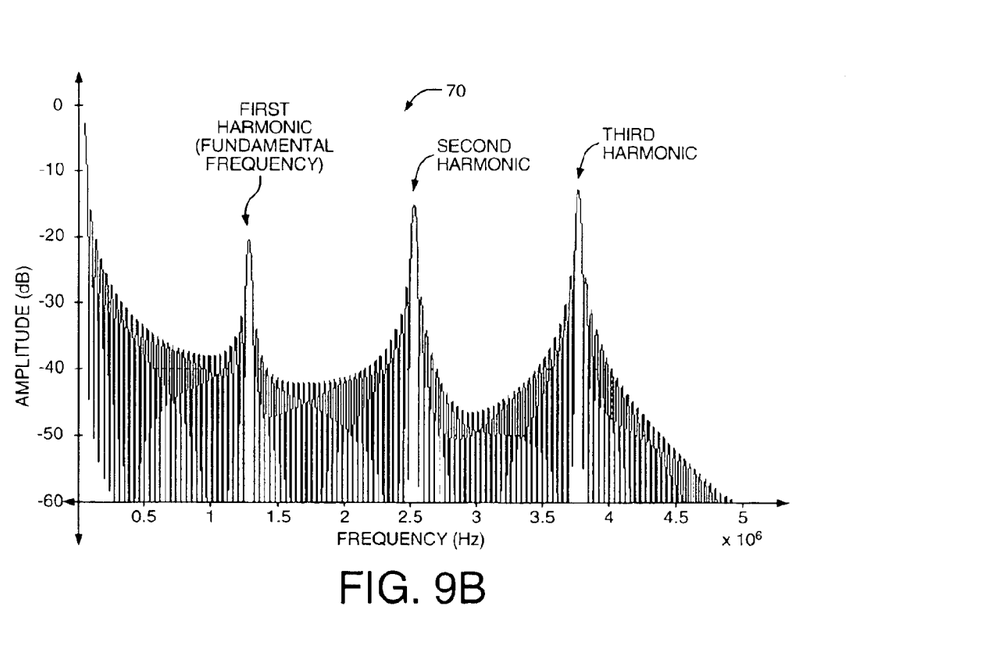
FIG. 9B is a graph in the frequency domain of the components of the third test signal of FIG. 8B.

FIG. 9B is a graph in the frequency domain of the components of a third test intermediate data stream 70, which results from third test signal 57.

As can be seen from FIGS. 6, 9A and 9B, the harmonic components of the signals fall at the same frequencies. The harmonic components fall at multiples of 1.25 MHz because the time periods of the first, second and third test signals are the same 0.8 microseconds. Accordingly, the same low-pass filter 27 filters out the harmonic components of each of the three test signals 55, 56 and 57. Second test signal 56 results in second test intermediate data stream 69 which in turn results in a second test digital data stream 76. Third test signal 57 results in third test intermediate data stream 70 which in turn results in a third test digital data stream 77.

The ratio PTP/T for the digital voltage amplitude of the dc component of second test digital data stream 69 is the ratio for second test signal 56, which equals one half. The ratio PTP/T for the digital voltage amplitude of the dc component of third test digital data stream 70 is the ratio for third test signal 57, which equals three quarters. Given that Vref is four volts, the first, second and third test digital data streams 75, 76 and 77 thereby have digital amplitudes corresponding to the precise voltage amplitudes of one volt, two volts and three volts, respectively.

Digital calibration processing circuit 23 can then enter data in calibration data location 90 for points 93, 94 and 95 depicted in FIG. 3. Digital calibration processing circuit 23 compares the test digital value of each of the points to the ideal digital value for a linear response between voltage and digital amplitude. The ideal digital values for each analog voltage are shown in FIG. 3 as line 103. After determining point 93 (1, 276), digital calibration processing circuit 23 enters minus twenty-one as the digital correction factor at 1.0 volt in calibration data location 90. Point 94 is located at (2, 373), and the digital correction factor at 2.0 volts is entered as one hundred thirty-eight in calibration data location 90, as shown in FIG. 4. Point 95 is located at (3, 613), and the digital correction factor at 3.0 volts is entered as one hundred fifty-four in the calibration data location 90.

In this example, calibration is complete at this point. For each range of digital amplitude, a corresponding digital correction factor is present in calibration data location 90. After SCADC 20 is operated in the calibration mode, SCADC 20 is operated in the operational mode as follows.

The digital correction factors entered in calibration data location 90 during the calibration mode are used in the operational mode to calibrate SDC 21. In the operational mode, digital calibration processing circuit 23 sends a digital one as test circuit select signal 63 to select input lead 60 causing second analog multiplexer 30 to select analog operational signal 64. Sigma-delta modulator 26 receives analog operational signal 64 and converts it into a digital operational intermediate data stream 104. Digital low-pass filter 27 filters operational intermediate data stream 104 and outputs a ten-bit operational digital data stream 105, for which each successive ten-bit value is the uncorrected digital value resulting when analog operational signal 64 is supplied to the input of SDC 21.

Digital calibration processing circuit 23 corrects the operational digital data stream 105 output from SDC 21 by compensating for dc offset error, gain error and INL error using the digital correction factors in the calibration data location 90. Digital calibration processing circuit 23 adds a digital correction factor to each digital value of operational digital data stream 105 depending on the range in which the digital value falls. Digital correction factors are added to digital values falling in each of eight ranges A–I (81–89), as shown in FIG. 4. For example, minus sixty-two is added to all digital values in range A (81) from digital zero to digital ninety-five, and minus twenty-one is added to all digital values in range C (83) from digital two hundred thirty-four to digital two hundred ninety-nine. Digital calibration processing circuit 23 then outputs the corrected digital data stream 91. To account for the event that more than ten bits are required to express a digital value that results from adding a digital correction factor to a digital value of operational digital data stream 105, the corrected digital data stream 91 can be output on an eight-bit bus as a digital value having more than ten bits.

After digital calibration processing circuit 23 outputs the corrected digital data stream 91, the digital correction factors in the calibration data location 90 of RAM 24 can be overwritten. This frees up memory in RAM 24 to be used for other purposes. Running the calibration mode immediately prior to the operational mode has two advantages. First, the time during which calibration data location 90 of RAM 24 is occupied by digital correction factors is reduced by reducing the time between running the calibration mode and running the operational mode. Second, dc offset error, gain error and INL error can vary depending on the temperature of the chip on which SCADC 20 is located. Over time, as the temperature of the chip changes, the SCADC becomes somewhat uncalibrated. The different types of error (for example, dc offset error, gain error and INL error) can change in different ways. By running the calibration mode immediately prior to the operational mode, the temperature at which the digital correction factors are determined is as close as possible to the temperature at which the operational signal is digitized.

Although one digital value (to be loaded into shift register 28) is described above to generate each test signal with a dc component having a distinct voltage amplitude, some distinct voltage amplitudes can be generated using multiple digital values. For example, multiple possible pulse select signals from eight-bit shift register 28 correspond to a digital voltage amplitude of one half Vref. Some of these pulse select signals result from the digital values: 10101010, 11001100, 11110000, 10011010, 10001101, 11000110, 10100110. When choosing between multiple possible pulse select signals that correspond to the same digital voltage amplitude, a pulse select signal that produces harmonic components that match the notches 102 of low-pass filter 27 can be chosen. Which nine of the possible one hundred twenty-eight pulse select signals are used and in what order is governed by test program 25.

Although, in the examples shown above, SCADC 20 compensates for dc offset error, gain error and INL error of the SDC 21, SCADC 20 also compensates for other types of error. Regardless of the type of error, SCADC 20 generates test digital values from which correction factors can be calculated. Although in the embodiment of SCADC 20 described above, distinct digital correction factors are added to those digital values of operational digital data streams that fall within certain ranges, other ways of applying the correction factors are possible. In a second approach, for example, a dc offset correction factor can first be added to each digital value of an operational digital data stream. Each resulting sum can then be multiplied by a gain correction factor. Finally, distinct INL correction factors can be added to certain of the resulting products that fall within corresponding ranges. Alternatively, digital correction factors for one or more types of error can be applied to the digital values of an operational digital data stream.

Although the present invention has been described in connection with certain specific embodiments for instructional purposes, the present invention is not limited thereto. In the example of FIG. 3 above, operational digital data streams are corrected by adding individual digital correction factors to digital values within digital ranges corresponding to half-volt steps. The half-volt steps result from a Vref of four volts being divided by eight due to there being eight bits in shift register 28. In another embodiment, shift register 28 has many more than eight bits. Digital ranges corresponding to arbitrarily small steps of voltage are therefore possible. In yet another embodiment, the limited number of points obtained from digitizing test signals having dc components with precise voltage amplitudes is used mathematically to derive a function (for example, a polynomial function) correlating test digital values of digital amplitude to analog voltage amplitudes of test signals. Using the function, a correction factor is determined for any input analog voltage. More correction factors can be determined than the number of test signals generated.

Although a negative digital correction factor compensates for dc offset error in the example shown in FIG. 3, dc offset error in other examples is compensated for with a positive digital correction factor. Although a digital correction factor of greater than one compensates for the gain error in the example shown in FIG. 3, gain error in other examples is compensated for with a digital correction factor of less than one.

Although the analog-to-digital converter digitizes input voltages from ground potential to Vref, this need not be the case. An analog-to-digital converter in accordance with some embodiments digitizes input voltages from a negative reference voltage to a positive reference voltage. In such an example, the voltages on the first and second data input leads of first analog multiplexer 29 can be the negative reference voltage and the positive reference voltage. Although an analog multiplexer is used as a level shifter to increase the magnitude of voltage swing of a test signal from Vcc to Vref, other circuitry can be used for this purpose. A digital logic gate, inverter or buffer powered by Vref may, for example, be used. Where the voltage range of the analog operational input signal has a magnitude less than Vcc, no level shifting is required. First analog multiplexer 29 can be omitted. Accordingly, various modifications, adaptations, and combinations of various features of the described embodiments can be practiced without departing from the scope of the invention as set forth in the claims.

What is claimed is:

1. A integrated circuit comprising:
    a sigma-delta converter (SDC) having an input lead; and
    a test circuit that supplies a test signal to the input lead of the SDC in a calibration mode, the test signal having a substantially rectangular time domain periodic waveform, the test signal having a time period (T), a pulse time portion (PTP) and a remaining time portion, the test signal having a reference voltage (Vref) during the pulse time portion and a ground potential during the remaining time portion, the test signal having a dc component and harmonic components, the dc component having a voltage amplitude equal to: Vref(PTP/T).

2. The integrated circuit of claim 1, further comprising:
    a digital calibration processing circuit that compares a test digital value output by the SDC to an ideal digital value.

3. The integrated circuit of claim 2, wherein the ideal digital value is a function of (PTP/T).

4. The integrated circuit of claim 1, wherein at least part of the test circuit is digital logic powered by a supply voltage Vcc, and wherein the reference voltage Vref is Vcc.

5. The integrated circuit of claim 1, wherein the test circuit includes a shift register.

6. A circuit comprising:
    a sigma-delta modulator (SDM), the SDM having a SDM input lead and a SDM output lead;
    a low-pass filter having an input lead coupled to the SDM output lead; and
    a test circuit comprising a shift register and a first analog multiplexer, the first analog multiplexer having an output lead, the output lead of the first analog multiplexer being coupled to the SDM input lead.

7. The circuit of claim 6, wherein the shift register has an output lead and the first analog multiplexer has a select input lead, the output lead of the shift register being coupled to the select input lead of the first analog multiplexer, the shift register outputting a first pulse select signal.

8. A circuit comprising:
    a sigma-delta modulator (SDM), the SDM having a SDM input lead and a SDM output lead;
    a low-pass filter having an input lead coupled to the SDM output lead; and
    a test circuit comprising a shift register and a first analog multiplexer, the first analog multiplexer having an output lead, the output lead of the first analog multiplexer being coupled to the SDM input lead, wherein the first analog multiplexer has a first data input lead and a second data input lead, a reference voltage (Vref) being present on the first data input lead, a ground potential being present on the second data input lead, the first analog multiplexer outputting a first test signal in a calibration mode, the first test signal having a substantially rectangular time domain periodic waveform with a time period (T), the first test signal having a pulse time portion (PTP) and a remaining time portion, the first test signal having the reference voltage during the pulse time portion and the ground potential during the remaining time portion, the SDM receiving the first test signal, wherein the first test signal has a dc component having a voltage amplitude equal to: Vref (PTP/T).

9. The circuit of claim 8, further comprising:
    an operational signal input lead, wherein the test circuit further comprises a second analog multiplexer, the second analog multiplexer having a first data input lead, a second data input lead and an output lead, the first data input lead of the second analog multiplexer being coupled to the output lead of the first analog multiplexer, the second data input lead of the second analog multiplexer being coupled to the operational signal input lead, and the output lead of the second analog multiplexer being coupled to the SDM input lead.

10. The circuit of claim 9, wherein in a calibration mode, the second analog multiplexer outputs the first test signal present on the first data input lead of the second analog multiplexer, and wherein in an operational mode the second analog multiplexer outputs an operational signal present on the second data input lead of the second analog multiplexer.

11. The circuit of claim 8, wherein the SDM digitizes the first test signal and outputs a first test intermediate data stream having a dc component and harmonic components and wherein the low-pass filter receives the first test intermediate data stream and filters out substantially all the harmonic components.

12. The circuit of claim 11, wherein the harmonic components of the first test intermediate data stream have frequencies that coincide with frequencies of harmonic components of the first test signal, wherein the low-pass filter has a transfer function with notch frequencies, and wherein the notch frequencies coincide with the harmonic frequencies of the first test intermediate data stream.

13. The circuit of claim 8, further comprising:
    a digital calibration processing circuit, the low-pass filter outputting a first test digital data stream, the digital calibration processing circuit receiving the first test digital data stream, the first test digital data stream having a maximum possible digital value, a minimum possible digital value and a test digital value, the digital calibration processing circuit determining a correction factor, the correction factor being the difference between the test digital value and an ideal digital value, the ideal digital value equaling a quotient (PTP/T) times the difference of the maximum possible digital value minus the minimum possible digital value.

14. The circuit of claim 13, wherein in an operational mode the SDM receives an operational signal and outputs an operational intermediate data stream, the low-pass filter receives the operational intermediate data stream and outputs an operational digital data stream, the digital calibration processing circuit receives the operational digital data stream, the operational digital data stream comprising digital values, the digital calibration processing circuit adding the correction factor to one of the digital values of the operational digital data stream.

15. The circuit of claim 8, wherein in the calibration mode the first analog multiplexer outputs a second test signal after outputting the first test signal, the second test signal having a second dc component different from the dc component of the first test signal.

16. A method, comprising:

in a calibration mode:

generating a first test signal, the first test signal having a substantially rectangular time domain periodic waveform, the first test signal having a time period (T), a pulse time portion (PTP) and a remaining time portion, the first test signal having a reference voltage (Vref) during the pulse time portion and a ground potential during the remaining time portion, the first test signal having a dc component and harmonic components, the dc component having a voltage amplitude equal to: Vref(PTP/T);

digitizing the first test signal such that a first test intermediate data stream having a dc component and harmonic components is obtained;

passing the dc component of the first test intermediate data stream through a low-pass filter such that the low-pass filter filters out substantially all of the harmonic components of the first test intermediate data stream, the low-pass filter outputting a first test digital data stream, the first test digital data stream having a maximum possible digital value, a minimum possible digital value and a test digital value; and calculating a correction factor by comparing the test digital value to an ideal digital value, the ideal digital value being equal to a quotient (PTP/T) times the difference of the maximum possible digital value minus the minimum possible digital value.

17. The method of claim 16, wherein the correction factor is equal to the difference between the test digital value and the ideal digital value.

18. The method of claim 16, further comprising:

in an operational mode:

receiving an analog operational signal;

generating an operational intermediate data stream, the operational intermediate data stream having an error;

passing the operational intermediate data stream through the low-pass filter, the low-pass filter outputting an operational digital data stream, the operational digital data stream comprising digital values, a first of the digital values representing a first digital voltage amplitude, the first of the digital values containing the error; and adding the correction factor to the first of the digital values to obtain a corrected first digital value, the corrected first digital value not containing the error.

19. The method of claim 18, wherein the adding the correction factor comprises:

separating the digital values of the operational digital data stream into ranges, wherein at least one of the digital values lies within a first range; and adding the correction factor to all of the digital values that lie within the first range.

20. A self-calibrating sigma-delta analog-to-digital converter comprising:

means for generating a test signal, the test signal having a substantially rectangular time domain periodic waveform, the test signal having a time period (T), a pulse time portion (PTP) and a remaining time portion, the test signal having a reference voltage (Vref) during the pulse time portion and a ground potential during the remaining time portion; and a sigma-delta converter portion that 1) in a calibration mode receives the test signal and outputs a test digital data stream, and that 2) in an operational mode receives an operational signal and outputs an operational digital data stream.

21. The self-calibrating sigma-delta analog-to-digital converter of claim 20, wherein the test digital data stream comprises a plurality of test digital values, the self-calibrating sigma-delta analog-to-digital converter further comprising:

means for comparing, in the calibration mode, one of the test digital values to an ideal digital value and thereby determining an error in the test digital value.

22. The self-calibrating sigma-delta analog-to-digital converter of claim 20, wherein the sigma-delta converter portion comprises a digital low-pass filter, the digital low-pass filter having a transfer function with notch frequencies, and wherein the test signal has a dc component and a plurality of harmonic components, each of the harmonic components having a harmonic frequency, and wherein the notch frequencies of the transfer function substantially coincide with the harmonic frequencies of the test signal.

23. The self-calibrating sigma-delta analog-to-digital converter of claim 20, wherein the means for comparing is a processor, and wherein the self-calibrating sigma-delta analog-to-digital converter is disposed on a single integrated circuit.

24. The self-calibrating sigma-delta analog-to-digital converter of claim 20, wherein the test signal has a dc component having a voltage amplitude equal to: Vref(PTP/T).

25. A method, comprising:

generating a test signal, the test signal having a substantially rectangular time domain periodic waveform, the test signal having a time period (T), a pulse time portion (PTP) and a remaining time portion, the test signal having a reference voltage (Vref) during the pulse time portion and a ground potential during the remaining time portion, the test signal having a dc component and harmonic components, the dc component having a voltage amplitude equal to: Vref(PTP/T);

digitizing the test signal such that a test intermediate data stream having a dc component and harmonic components is obtained;

passing the dc component of the test intermediate data stream through a low-pass filter such that the low-pass filter filters out substantially all of the harmonic components of the test intermediate data stream, the low-pass filter outputting a test digital data stream, the test digital data stream having a maximum possible digital value, a minimum possible digital value and a test digital value; and calculating a correction factor by comparing the test digital value to an ideal digital value, the ideal digital value being equal to a quotient (PTP/T) times the difference of the maximum possible digital value minus the minimum possible digital value.

* * * * *